United States Patent
Kimura et al.

(10) Patent No.: US 9,784,784 B2
(45) Date of Patent: Oct. 10, 2017

(54) SIGNAL PROCESSING DEVICE AND METHOD AND RADIATION DETECTING DEVICE FOR A PILEUP PHENOMENON

(71) Applicant: KABUSHIKI KAISHA TOSHIBA, Tokyo (JP)

(72) Inventors: Shunsuke Kimura, Kanagawa (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 280 days.

(21) Appl. No.: 14/846,143

(22) Filed: Sep. 4, 2015

(65) Prior Publication Data

US 2016/0077148 A1 Mar. 17, 2016

(30) Foreign Application Priority Data

Sep. 16, 2014 (JP) .................................. 2014-188254

(51) Int. Cl.
  *G01R 31/26* (2014.01)
  *G01T 1/20* (2006.01)
  *G01T 1/17* (2006.01)

(52) U.S. Cl.
  CPC .......... *G01R 31/2635* (2013.01); *G01T 1/171* (2013.01); *G01T 1/20* (2013.01)

(58) Field of Classification Search
  None
  See application file for complete search history.

(56) References Cited

U.S. PATENT DOCUMENTS

| 3,525,047 A | * | 8/1970 | Schwartz | .................. G01T 1/17 250/369 |
| 3,673,559 A | * | 6/1972 | Schwartz | ................ E21B 47/12 250/262 |
| 4,535,242 A | * | 8/1985 | Dirkse | ...................... G01T 1/17 250/363.02 |

(Continued)

FOREIGN PATENT DOCUMENTS

| JP | 2002-350545 | 12/2002 |
| JP | 2003-043149 | 2/2003 |

(Continued)

*Primary Examiner* — J. H. Hur
(74) *Attorney, Agent, or Firm* — Finnegan, Henderson, Farabow, Garrett & Dunner, L.L.P.

(57) ABSTRACT

According to an embodiment, a signal processing device includes a first integrator, a second integrator, a switcher, and a calculator. The first integrator is configured to integrate a current represented by a reference waveform equivalent to a normal waveform in a case of no pileup phenomenon regarding the current to calculate a first electrical charge. The second integrator is configured to integrate a current output from a photoelectric converter to calculate a second electrical charge. The switcher is configured to, when a pileup phenomenon has occurred, perform switching either to a state in which the first and second electrical charges are output or to a state in which the first electrical charge and a reference charge are output. The calculator is configured to calculate a first difference charge between the first and second electrical charges, and calculate a second difference charge between the first electrical charge and the reference charge.

7 Claims, 9 Drawing Sheets

(56) References Cited

U.S. PATENT DOCUMENTS

| | | | | |
|---|---|---|---|---|
| 5,210,423 A * | 5/1993 | Arseneau | ............... | G01T 1/17 250/362 |
| 5,225,682 A * | 7/1993 | Britton, Jr. | ............... | G01T 1/17 250/369 |
| 6,587,814 B1 * | 7/2003 | Warburton | ............ | G01R 29/02 702/190 |
| 6,609,075 B1 * | 8/2003 | Warburton | ............... | G01T 1/17 702/22 |
| 2003/0033097 A1 | 2/2003 | Tamaka | | |
| 2015/0069251 A1 * | 3/2015 | Nakazawa | ............... | G01T 1/17 250/362 |

FOREIGN PATENT DOCUMENTS

| | | |
|---|---|---|
| JP | 2009-229127 | 10/2009 |
| JP | 2013-246096 | 12/2013 |

\* cited by examiner

SIGNAL PROCESSING DEVICE AND METHOD AND RADIATION DETECTING DEVICE FOR A PILEUP PHENOMENON

CROSS-REFERENCE TO RELATED APPLICATION

This application is based upon and claims the benefit of priority from Japanese Patent Application No. 2014-188254, filed on Sep. 16, 2014; the entire contents of which are incorporated herein by reference.

FIELD

An embodiment described herein relates generally to a signal processing device, a radiation detecting device, and a signal processing method.

BACKGROUND

In recent years, development of silicon-based photomultipliers is being actively pursued. Moreover, there has been development regarding a weak-light detection system (such as a radiation detecting device for detecting X rays) using a scintillator and a photomultiplier. For example, a radiation detecting device is used in computed tomography (CT) that enables non-invasive imaging of patients or baggage. Particularly, as a photoelectric conversion element serving as the unit of detection of a photomultiplier, an Si photomultiplier is configured by connecting in parallel a plurality of series circuits of an avalanche photodiode (APD) and a quench resistance. The Si photomultiplier has a high signal-to-noise ratio and has a high dynamic range, and enables achieving low-voltage driving. In such a radiation detecting device in which a photoelectric conversion element is used, an electrical current is detected from the photoelectric conversion element, and integration is performed with respect to the electrical current to obtain an electrical charge and a voltage. Then, the voltage is subjected to sampling and holding before being subjected to analog-to-digital conversion.

On the other hand, in a radiation detecting device of the photon counting method, the arrival factor of X rays that are incident on the scintillator is estimated to be about $10^8$ [cps]. Thus, it is necessary to have a circuit capable of measuring high-speed and high-energy-resolution data simultaneously in few hundreds of channels. Moreover, the detectable count rate in such a radiation detecting device depends on the recovery time of the photoelectric conversion element and the conversion capability of the AD converter. In order to shorten the recovery time of the photoelectric conversion element, it is possible to think of a method in which the value of quench resistance of the photoelectric conversion element is reduced and the time constant is reduced. However, if the value of quench resistance is too small, then it may not be possible to perform the quenching operation. Thus, there is a limitation to shortening the recovery time. For that reason, regarding the phenomenon in which the photons of radiation (or scintillation light obtained by conversion by the scintillator) fall on the photoelectric conversion element (hereinafter, the phenomenon is called an event) occurs within the recovery time of the photoelectric conversion element, there occurs what is called a pileup phenomenon. Particularly, as the arrival factor of the photons increases, there is an increase in the probability of occurrence of a pileup phenomenon.

In the conventional technology, when a pileup phenomenon occurs, it is difficult to obtain the electrical charge regarding the current waveform related to the pileup phenomenon. Hence, when a pileup phenomenon is detected, counting is not performed regarding the current waveforms related to the pileup phenomenon. However, as described above, in an environment of a high arrival factor of the photons, if counting is not performed regarding the current waveforms related to the pileup phenomenon, then the number of events of photon incidence decreases, thereby resulting in an error in the wave height discrimination value.

DETAILED DESCRIPTION

Figure 1:
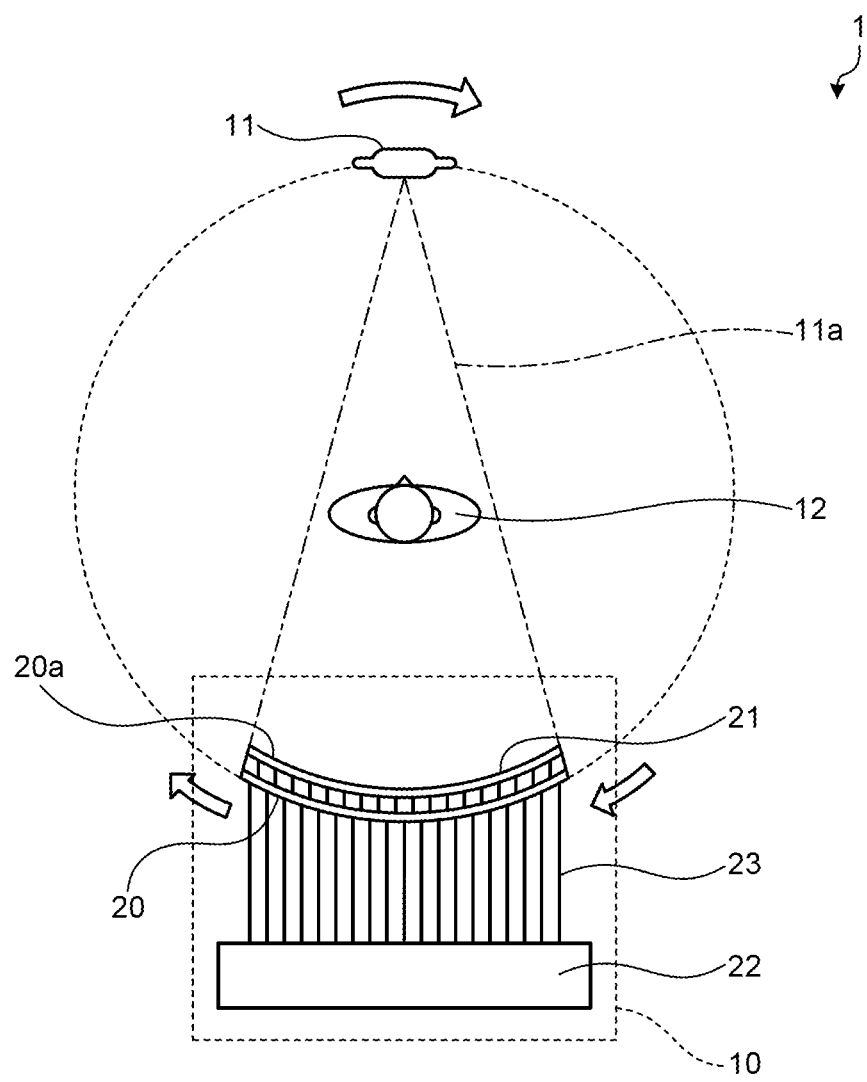
FIG. 1 is a diagram illustrating an exemplary configuration of a radiation inspection device.

According to an embodiment, a signal processing device includes a determiner, a holder, a generator, a first integrator, a second integrator, a switcher, and a difference calculator. The determiner is configured to determine whether a pileup phenomenon has occurred in a first electrical current output from a photoelectric converter for converting incident radiation into the first electrical current in a direct manner or an indirect manner. The holder is configured to hold an initial peak value of the first electrical current from the start of reception of the first electrical current from the photoelectric converter. The generator is configured to, when the determiner determines that a pileup phenomenon has occurred, generate, using the peak value, a reference waveform that is equivalent to a normal waveform in a case in which a pileup phenomenon does not occur regarding the first electrical current. The first integrator is configured to integrate a second electrical current represented by the reference waveform to calculate a first electrical charge. The second integrator is configured to integrate the first electrical current output from the photoelectric converter to calculate a second electrical charge. The switcher is configured to, when the determiner determines that a pileup phenomenon has occurred, perform switching either to a first state in which the first electrical charge and the second electrical charge are output or to a second state in which the first electrical charge and a reference charge are output. The difference calculator is configured to calculate a first difference charge representing difference between the first electrical charge and the second electrical charge output from the switcher, and calculate a second difference charge representing difference between the first electrical charge and the reference charge output from the switcher.

An exemplary embodiment of a signal processing device, a radiation detecting device, and a signal processing method according to the invention is described below in detail with reference to the accompanying drawings. In the accompanying drawings, the same constituent elements are referred to by the same reference numerals. However, the drawings are only schematic in nature, and the specific configuration should be determined by taking into account the explanation given below.

FIG. 1 is a diagram illustrating an exemplary configuration of a radiation inspection device. Thus, explained with reference to FIG. 1 is the brief outline of the overall configuration of a radiation inspection device 1.

As illustrated in FIG. 1, the radiation inspection device 1 includes a radiation tube 11 and a radiation detecting device 10 that is installed opposite to the radiation tube 11 across a test subject 12.

The radiation tube 11 is a vacuum tube that emits radiation beams 11a of X rays in a fan-like shape toward the radiation detecting device 10 that is installed opposite to the radiation tube 11. The radiation beams 11a emitted from the radiation tube 11 pass through the test subject 12, who is made to lie on a mount (not illustrated), and fall on the radiation detecting device 10.

In the radiation detecting device 10, of the radiation beams 11a emitted from the radiation tube 11, at least some radiation beams 11a that pass through the test subject 12 are received on an incidence plane 20a. Then, the radiation is converted into scintillation light including at least either ultraviolet light, or visible light, or infrared light; and the scintillation light is detected in the form of electrical signals. The radiation detecting device 10 includes a plurality of radiation detecting units 20 arranged in a substantially arc-like manner; a collimator 21 that is disposed on the side of the incidence plane 20a of the radiation detecting units 20; and a signal processing device 22 that is connected by signal lines 23 to an electrode on the opposite side of the radiation detecting units 20 to the side of the radiation tube 11.

Each radiation detecting unit 20 converts the radiation (the radiation beams 11a), which is incident via the incidence plane 20a, into scintillation light; and converts the scintillation light into electrical signals (an electrical current) (i.e., performs photoelectric conversion) using a photoelectric conversion element 32 (described later).

The collimator 21 represents an optical system that is disposed on the side of the incidence plane 20a of the radiation detecting units 20, and that performs refraction in such a way that the radiation is incident in parallel with respect to the radiation detecting units 20.

The signal processing device 22 detects an event by receiving the electrical signals (the electrical current), which are obtained by means of photoelectric conversion by the radiation detecting units 20, via the signal lines 23; and calculates the energy of the radiation incident on each radiation detecting unit 20.

The radiation tube 11 and the radiation detecting device 10 are disposed to rotate around the test subject 12. As a result, the radiation inspection device 1 can generate sectional images of the test subject 12. Meanwhile, the radiation inspection device 1 that includes the radiation detecting device 10 can be implemented in various devices such as a security device for seeing through the inside of articles, or an X-ray imaging machine, or an X-ray CT device (CT stands for Computed Tomography), or a multichannel analyzer.

Figure 2:
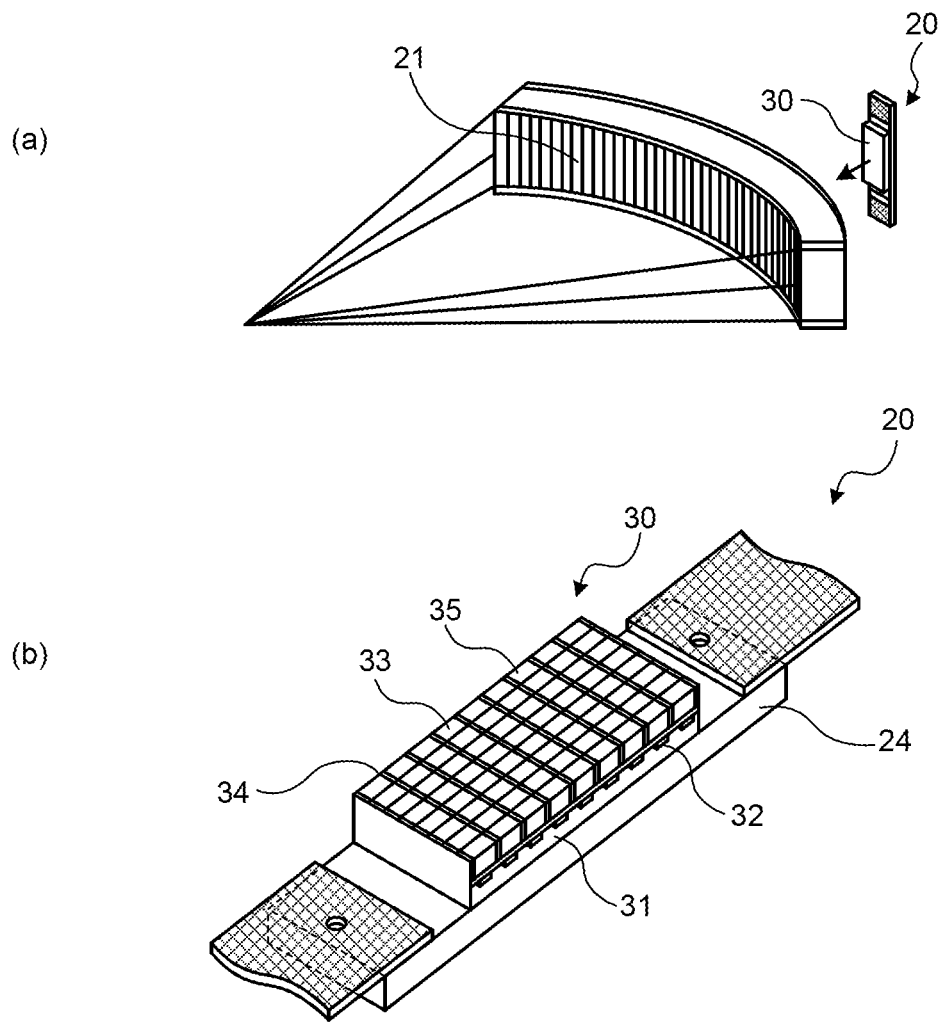
FIG. 2 is a diagram illustrating an exemplary configuration of a radiation detector.

FIG. 2 is a diagram illustrating an exemplary configuration of a radiation detector. Thus, explained with reference to FIG. 2 is a configuration of the radiation detecting units 20 and a radiation detector 30. In FIG. 2, (a) illustrates a configuration of the radiation detecting units 20 arranged in a substantially arc-like manner; and (b) illustrates an overall configuration of the radiation detector 30 in each radiation detecting unit 20.

As illustrated in (a) in FIG. 2, the radiation detecting units 20 are arranged in a substantially arc-like manner, and the collimator 21 is disposed on the side of the radiation incidence plane. As illustrated in (b) in FIG. 2, in each radiation detecting unit 20, the radiation detector 30 is fixed on an element support plate 24. The radiation detector 30 includes a photoelectric conversion layer 31, which has a plurality of photoelectric conversion elements 32 disposed therein, and a scintillator 33 that converts the radiation into scintillation light. The photoelectric conversion layer 31 and the scintillator 33 form a laminated structure in which the incidence plane side of the photoelectric conversion layer 31 and the emission surface side of the scintillator 33 are bonded by a bonding layer.

The scintillator 33 includes light reflectors 34 formed at a predetermined pitch in two cross directions. Due to the light reflectors 34, the photoelectric conversion layer 31 and the scintillator 33 are demarcated into a plurality of photoelectric converters 35 arranged in a matrix-like manner. Each photoelectric converter 35 includes a plurality of photoelectric conversion elements 32. Thus, the detection of events and the detection of the energy of the incident radiation is carried out in each photoelectric converter 35.

The radiation, such as X rays, emitted from the radiation tube 11 (see FIG. 1) falls on the scintillator 33. Then, due to the scintillator 33, the radiation gets converted into scintillation light including at least either ultraviolet light, or visible light, or infrared light, each of which has a longer wavelength than the radiation in the form of electromagnetic waves. The scintillation light then passes through the scintillator 33 while getting reflected by the light reflectors 34, and travels toward the photoelectric conversion layer 31.

The scintillation light coming out from the scintillator 33 falls on the photoelectric conversion elements 32 that are formed in the photoelectric conversion layer 31. In the photoelectric conversion elements 32, due to the avalanche breakdown occurring as a result of the incidence of the scintillation light (photons), electrical continuity is achieved in the direction from the cathode side toward the anode side (in the reverse biasing direction) of APDs of the photoelectric conversion elements 32.

The photoelectric conversion elements 32 are applied with a voltage for reverse biasing by the signal processing device 22 (see FIG. 1). At that time, as a result of achieving electrical continuity in the reverse biasing direction due to the incidence of photons on the photoelectric conversion elements 32, an electrical current in the reverse biasing direction flows to each photoelectric conversion element 32 (to an APD and a quench resistance connected in series to the APD). Then, that electrical current is detected by the signal processing device 22 via the signal lines 23.

The current value of the electrical current flowing to the photoelectric conversion elements 32 in the reverse biasing direction is almost not affected by the number of incident photons (i.e., almost not affected by the intensity of the scintillation light). For example, as compared to the value of the electrical current flowing to a single photoelectric conversion element 32 on which 100 photons are incident, the total value of the current flowing to 10 photoelectric conversion elements 32 on each of which 10 of the 100 photons are incident is about 10 times. Thus, in order to accurately detect the intensity (the electrical current) of the radiation incident on each photoelectric converter 35 that includes a circuit having parallel connection of a plurality of photoelectric conversion elements 32, it is necessary that the scintillation light is uniformly incident on the photoelectric conversion elements 32 of that photoelectric converter 35. In this way, when the scintillation light that has fallen on the photoelectric conversion layer 31 uniformly falls on a plurality of photoelectric conversion elements 32; in the photoelectric converter 35, a current value is detected that accurately reflects the intensity of the scintillation light, that is, the intensity of the radiation incident on the radiation detector 30.

Figure 3:
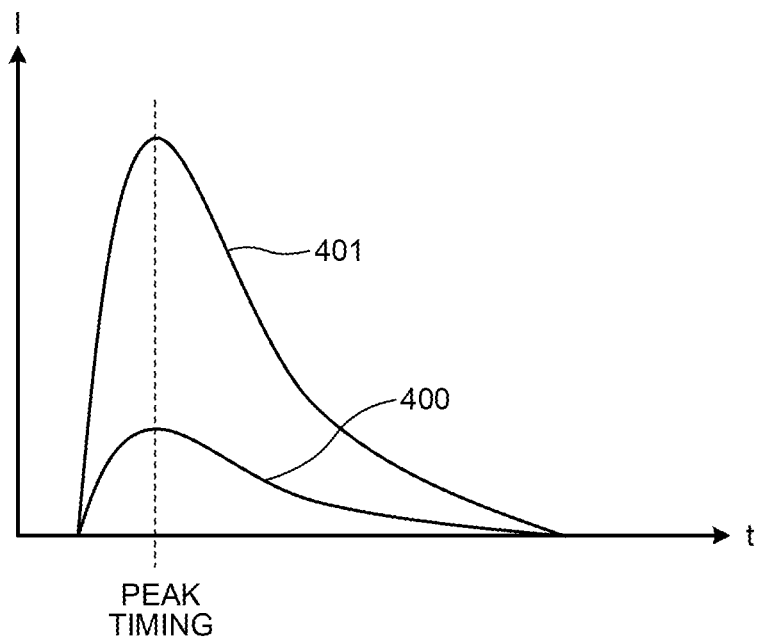
FIG. 3 is a diagram illustrating exemplary current waveforms detected in a photoelectric converter.

FIG. 3 is a diagram illustrating exemplary current waveforms detected in a photoelectric converter. Thus, explained with reference to FIG. 3 are current waveforms detected in the photoelectric converter 35.

As illustrated in FIG. 3, for example, a current waveform 400 represents the waveform of the electrical current detected in the case in which 10 photons are incident on the photoelectric converter 35. As described above, the photoelectric converter 35 includes a circuit having parallel connection of a plurality of photoelectric conversion elements 32. When the photons (in this case, 10 photons) are simultaneously incident on a plurality of photoelectric conversion elements 32, in each of which an APD and a quench resistance are connected in series, a current waveform (hereinafter, called a normal waveform) is detected in which the pileup phenomenon does not occur and which has the shape of the current waveform 400. On the other hand, if there is a mismatch in the timing at which the photons are incident on each photoelectric conversion element 32 of the photoelectric converter 35, there occurs a pileup phenomenon in which the waveforms of the electrical current flowing to a plurality of photoelectric conversion elements 32, on which the photons are incident, overlap each other. The waveform formed as a result of the pileup phenomenon attributed to the overlapping of the waveforms of the electrical current is hereinafter called a pileup waveform. The explanation about the pileup waveform is given later with reference to FIG. 5.

Meanwhile, a current waveform 401 illustrated in FIG. 3 represents the waveform of the electrical current detected in the case in which 100 photons are incident on the photoelectric converter 35. Regarding the current waveform 401 too, it is assumed that the photons (in this case, 100 photons) are simultaneously incident on a plurality of photoelectric conversion elements 32. In this case, as illustrated in FIG. 3, the current waveforms 400 and 401 have an almost identical timing for the waveform peak. Moreover, the peak value of the electrical current in the current waveform 401 is about 10 times greater than the peak value of the electrical current in the current waveform 400.

Moreover, as described above, each photoelectric conversion element 32 is configured with a series circuit of an APD and a quench resistance. Hence, even if photons fall on the APD and electrical continuity is achieved, due to the time constant based on the resistance value of the quench resistance, the normal waveform has a tail portion in which the electrical current gradually decreases from the peak of electrical current as illustrated in FIG. 3.

Figure 4:
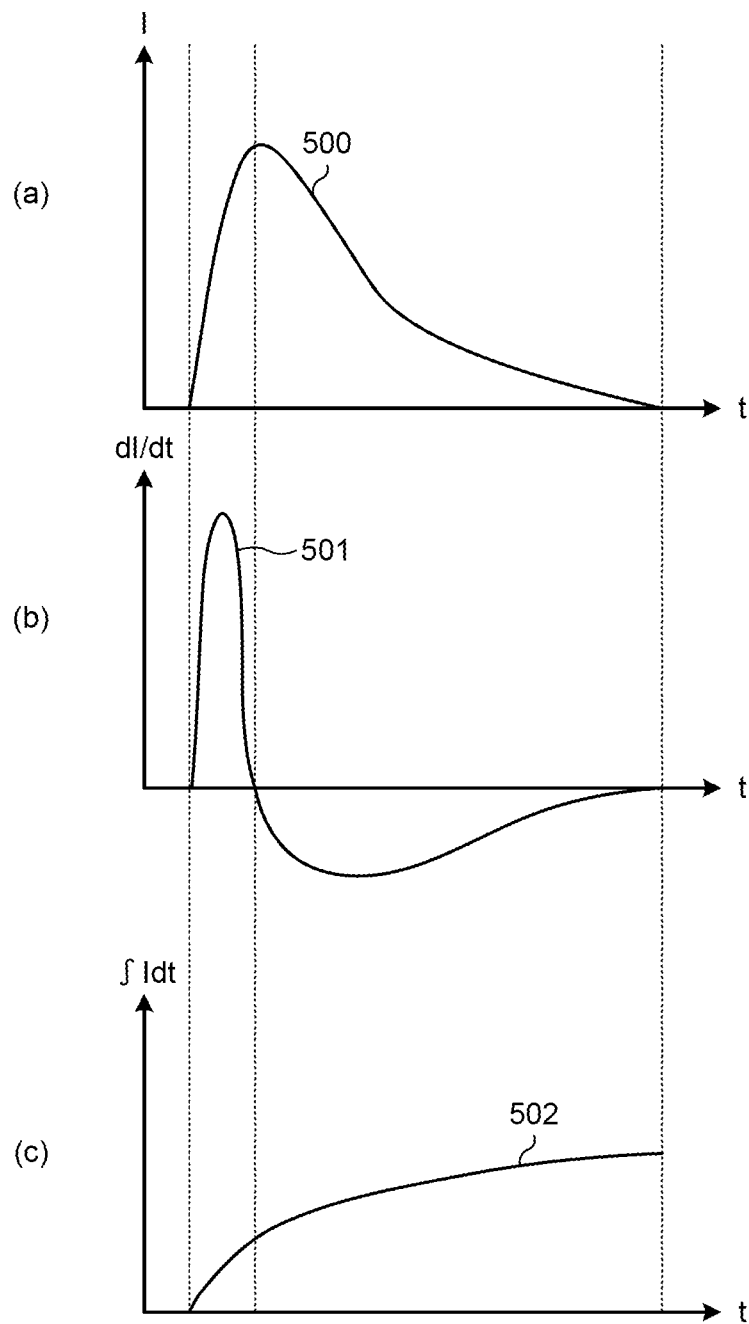
FIG. 4 is a diagram illustrating an example of a differentiated waveform and a charge waveform for a normal waveform.
Figure 5:
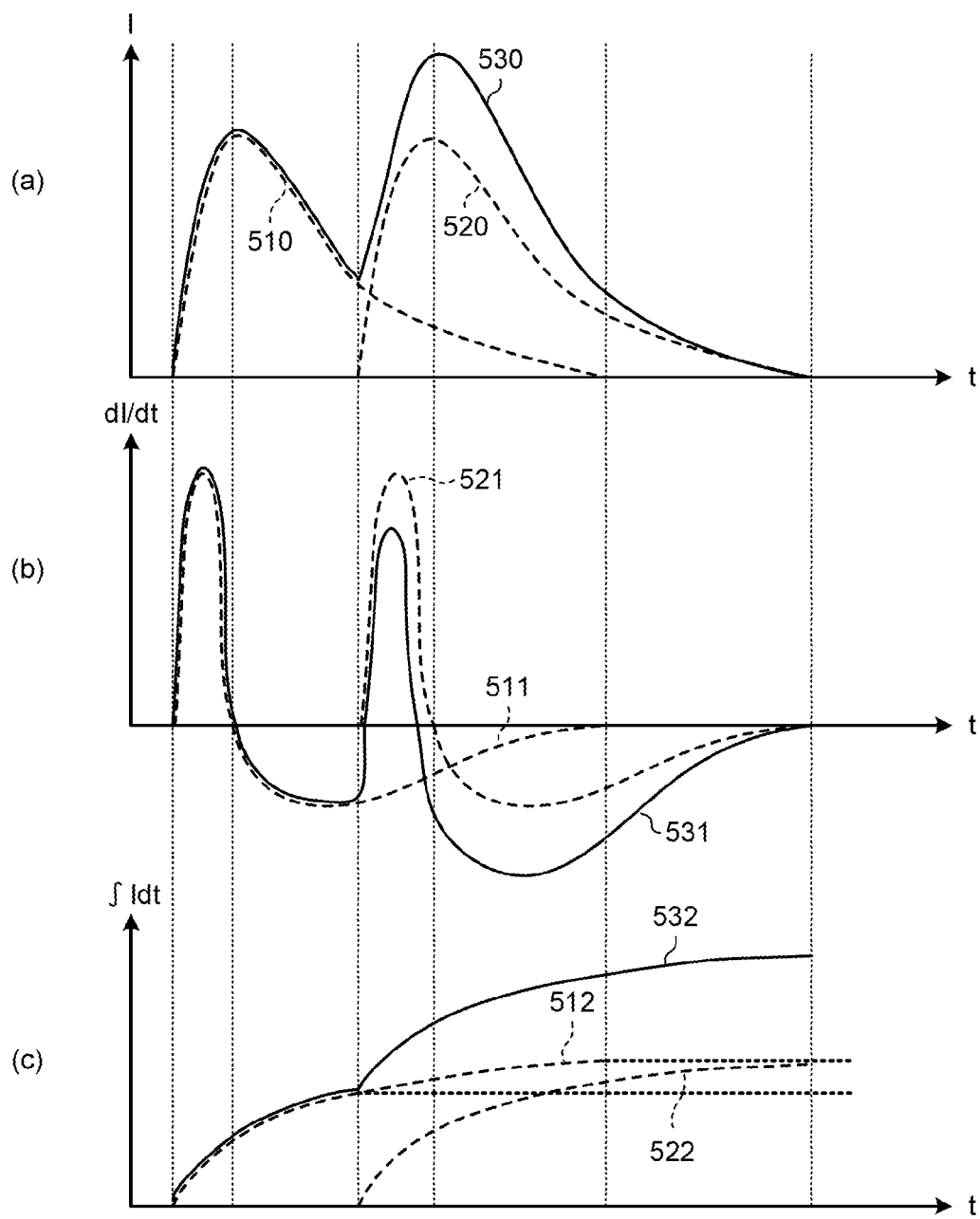
FIG. 5 is a diagram illustrating an example of a differentiated waveform and a charge waveform for a pileup waveform.

FIG. 4 is a diagram illustrating an example of a differentiated waveform and a charge waveform for a normal waveform. FIG. 5 is a diagram illustrating an example of a differentiated waveform and a charge waveform for a pileup waveform.

Firstly, explained below with reference to FIG. 4 is a differentiated waveform and a charge waveform for a normal waveform. When the radiation from the radiation tube 11 is incident on each photoelectric converter 35 and the photons fall on the APD of each photoelectric conversion element 32, it results in the flow of an electrical current represented by a normal waveform 500 in (a) in FIG. 4. As described above, since each photoelectric conversion element 32 has a quench resistance connected serially to an APD, the electrical current represented by the normal waveform 500 does not immediately become equal to "0", thereby resulting in a tail portion.

In (b) in FIG. 4 is illustrated a differentiated waveform 501 that represents the waveform of a differential value dI/dt obtained by differentiating an electrical current I illustrated in the normal waveform 500. In the differentiated waveform 501 illustrated in (b) in FIG. 4, the point of time at which the differential value dI/dt reaches "0" in the direction from positive values toward negative values and the point of time at which the differential value dI/dt reaches "0" in the direction from negative values toward positive values represent zero crossing points in the normal waveform 500 illustrated in (a) in FIG. 4 at which the tilt is "0". More particularly, the timing at which the zero crossing point in a rising curve is detected in the case in which the differential value dI/dt illustrated in the differentiated waveform 501 in (b) in FIG. 4 moves from a positive value toward a negative value is same as the timing of generation of the normal waveform 500. Moreover, the timing at which the zero crossing point in a falling curve is detected in the case in which the differential value dI/dt illustrated in the differentiated waveform 501 moves from a negative value toward a positive value is same as the timing of the peak of the normal waveform 500. Thus, the zero crossing points detected in the differentiated waveform 501 represent a set of a zero crossing point in a rising curve and a zero crossing point in a falling curve.

In (c) in FIG. 4 is illustrated a charge waveform 502 that represents the waveform of the electrical charge obtained by integrating the electrical current represented by the normal waveform 500 using an integrator. The electrical charge represented by the charge waveform 502 for the normal waveform 500 can be obtained in the form of the output value of the integrator.

Explained below with reference to FIG. 5 is a differentiated waveform for a pileup waveform (hereinafter, called a pileup differentiated waveform) and a charge waveform for a pileup waveform (hereinafter, called a pileup charge waveform). When the radiation from the radiation tube 11 is incident on each photoelectric converter 35 and the photons fall on the APD of each photoelectric conversion element 32, it results in the flow of an electrical current represented by a normal waveform 510 in (a) in FIG. 5. As described above, since the radiation has a high arrival factor, there are times when the next set of photons arrives before the tail portion of the normal waveform 510 decreases by a sufficient extent. In that case, the electrical current generated due to the next set of photons gets added to the electrical current attributed to the initially-arrived photons in the state in which no electrical current is output from the photoelectric converter 35. As a result, a higher signal than the height of the signal of the original electrical current (a normal waveform 520 illustrated in (a) in FIG. 5) is generated (i.e., a pileup phenomenon occurs). In (a) in FIG. 5 is illustrated a pileup waveform 530 that represents the waveform appearing as a higher signal than the height of the signal of the original normal waveform 520 as a result of a pileup of the normal waveform 520, which represents the waveform of the electrical current attributed to the subsequently-arrived photons, on the normal waveform 510, which represents the waveform of the electrical current attributed to the initially-arrived photons in the state in which no electrical current is output from the photoelectric converter 35.

In (b) in FIG. 5 is illustrated a waveform of the differential value dI/dt that is obtained by differentiating the electrical current I illustrated in (a) in FIG. 5. In (b) in FIG. 5, a differentiated waveform 511 represents the waveform obtained by differentiating the normal waveform 510; a differentiated waveform 521 represents the waveform obtained by differentiating the normal waveform 520; and a pileup differentiated waveform 531 represents the waveform obtained by differentiating the pileup waveform 530. The timings at which the zero crossing point in a rising curve is detected in the case in which the differential value dI/dt represented by the pileup differentiated waveform 531 in (b) in FIG. 5 moves from a negative value toward a positive value are same as the timing of generation of the normal waveform 510 and the timing at which the normal waveform 520 piles up on the normal waveform 510. Moreover, the timings at which the zero crossing point in a falling curve is detected in the case in which the differential value dI/dt represented by the pileup differentiated waveform 531 moves from a positive value toward a negative value are same as the timings of the peaks of the pileup waveform 530 that occur at two locations in the pileup differentiated waveform 531 as illustrated in (b) in FIG. 5. Thus, the zero crossing points detected in the pileup differentiated waveform 531 represent two sets of zero crossing points in a rising curve and two sets of zero crossing points in a falling curve.

In (c) in FIG. 5 is illustrated the waveform of the value of integral obtained by integrating the electrical current I illustrated in (a) in FIG. 5, that is, the waveform of an electrical charge Q. In (c) in FIG. 5, a charge waveform 512 represents the waveform obtained by integrating the normal waveform 510; a charge waveform 522 represents the waveform obtained by integrating the normal waveform 520; and a pileup charge waveform 532 represents the waveform obtained by integrating the pileup waveform 530. The electrical charge represented by such charge waveforms is obtained by an integrator 225 (described later) by performing an integration operation. Meanwhile, of the charge waveforms illustrated in (c) in FIG. 5, the charge waveform 522 represents the waveform of the electrical charge in the case in which the normal waveform 520 is hypothetically integrated. However, since the normal waveform 520 piles up on the normal waveform 510; in reality, the normal waveform 520 is not integrated by the integrator 225 to obtain the charge waveform 522.

Figure 6:
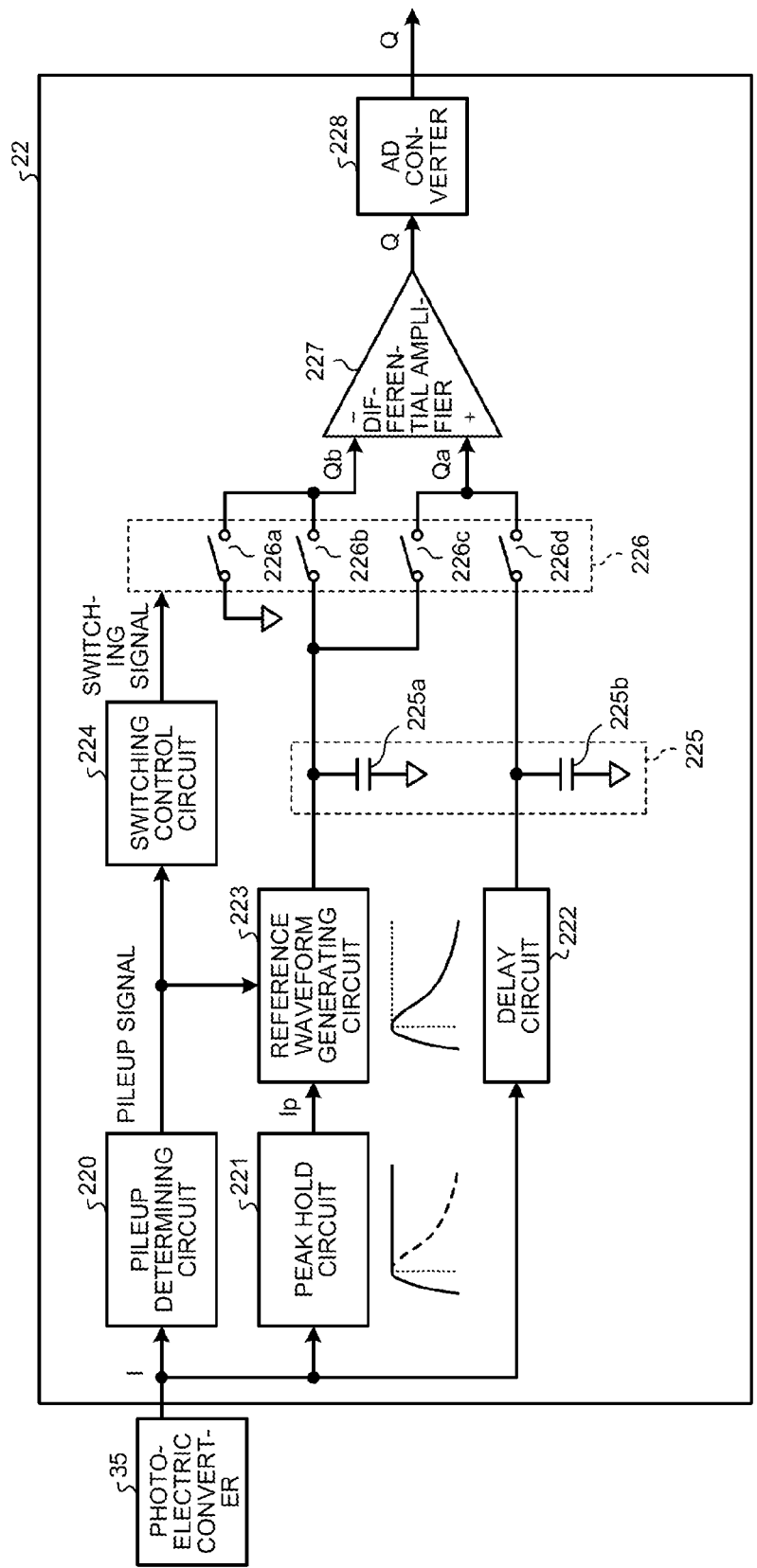
FIG. 6 is a diagram illustrating an exemplary circuit configuration of a signal processing device.

FIG. 6 is a diagram illustrating an exemplary circuit configuration of the signal processing device. Thus, explained below with reference to FIG. 6 is an exemplary configuration of a circuit block of the signal processing device 22 according to the embodiment.

As illustrated in FIG. 6, the signal processing device 22 includes a pileup determining circuit 220 (a determiner), a peak hold circuit 221 (a holder), a delay circuit (a delay circuit) 222, a reference waveform generating circuit 223 (a generator), a switching control circuit 224, the integrator 225, a switching circuit 226 (a switcher), a differential amplifier 227 (a difference calculator), and an analog-to-digital (AD) converter 228 (a converter).

The pileup determining circuit 220 receives the electrical current I which is detected by the photoelectric converter 35 and in which the intensity of radiation (the energy of photons) is reflected; and determines whether or not a pileup phenomenon has occurred regarding the electrical current I. More particularly, the pileup determining circuit 220 calculates the differential value dI/dt by performing a differentiation operation with respect to the electrical current I, and detects the zero crossing point from the waveform of the differential value dI/dt (a differentiated waveform). Then, the pileup determining circuit 220 generates a logic pulse (a block pulse) that causes rising if the zero crossing point in a rising curve is detected, or causes falling if the zero crossing point in a falling curve is detected. Subsequently, the pileup determining circuit 220 counts the number of times of rising of the logic pulse within a predetermined period of time starting from the point of time of receiving the electrical current I. If rising of the logic pulse is counted twice during the predetermined period of time, then the pileup determining circuit 220 determines that the pileup phenomenon has occurred, and outputs a pileup signal at the point of time of the second-time counting to the reference waveform generating circuit 223 and the switching control circuit 224. However, if rising of the logic pulse is counted only once during the predetermined period of time, then the pileup determining circuit 220 does not output a pileup signal. Meanwhile, for example, if the value of the electrical current I becomes equal to or greater than a predetermined threshold value, then the pileup determining circuit 220 can be configured to start the differentiation operation with respect to the electrical current I.

The peak hold circuit 221 receives the electrical current I from the photoelectric converter 35, and holds a peak value Ip representing the value of the first peak of the waveform representing the electrical current I. Then, the peak hold circuit 221 outputs the peak value Ip to the reference waveform generating circuit 223.

The delay circuit 222 receives the electrical current I from the photoelectric converter 35, and delays the output timing of the electrical current I by a predetermined period of time while maintaining the waveform of the electrical current I. More particularly, as described later, the delay circuit 222 delays the output timing of the electrical current I by a period of time equal to the processing time taken by the reference waveform generating circuit 223 for generating a reference waveform based on the peak value Ip.

The reference waveform generating circuit 223 is a circuit that, when a pileup signal is received from the pileup determining circuit 220, refers to the peak value Ip received from the peak hold circuit 221 and the time constant based on the resistance value of the quench resistance of the photoelectric conversion elements 32, and generates a reference waveform that represents recreation of the current waveform in the case of no occurrence of a pileup phenomenon regarding the waveform of the electrical current I. Then, the reference waveform generating circuit 223 outputs the electrical current represented by the recreated reference waveform to the integrator 225.

Based on whether or not a pileup signal is received from the pileup determining circuit 220, the switching control circuit 224 outputs a switching signal for switching between opening and closing switching elements of the switching circuit 226.

The integrator 225 performs an integration operation with respect to the electrical current output from the reference waveform generating circuit 223 and the delay circuit 222. The integrator 225 includes a capacitor 225a (a first integrator) and a capacitor 225b (a second integrator). In the capacitor 225a, the electrical charge gets stored when the electrical current output from the reference waveform generating circuit 223 flows in. In the capacitor 225b, the electrical charge gets stored when the electrical current output from the delay circuit 222 flows in. Meanwhile, the signal output by the integrator 225 represents the value of voltage accompanying the electrical charge stored in the capacitors 225a and 225b. However, since the value of electrical charge and the value of voltage bear a proportionality relationship, the following explanation is given under the assumption that the integrator 225 outputs the value of electrical charge.

The switching circuit 226 opens and closes switching elements 226a to 226d according to the switching signal output by the switching control circuit 224.

The differential amplifier 227 outputs the electrical charge Q representing the difference between an electrical charge Q1 input to the plus terminal of the differential amplifier 227 and an electrical charge Qb input to the minus terminal of the differential amplifier 227.

The AD converter 228 performs asynchronous AD conversion with respect to the signal of the electrical charge Q, which is output by the differential amplifier 227, and outputs the electrical charge Q in the form of a digital signal.

Figure 7:
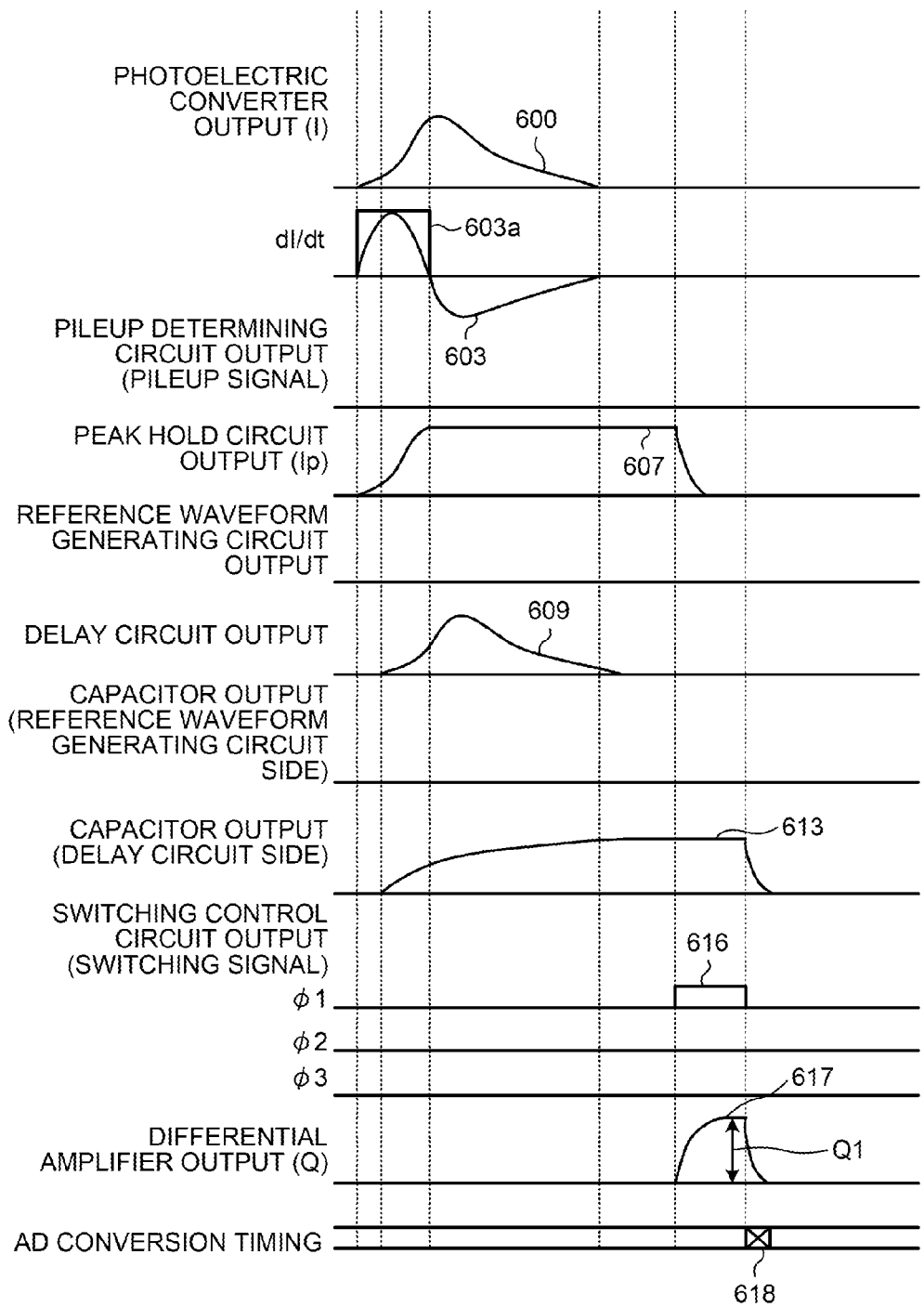
FIG. 7 is a timing chart of the signal processing performed by the signal processing device with respect to a normal waveform.

FIG. 7 is a timing chart of the signal processing performed by the signal processing device with respect to a normal waveform. Thus, explained with reference to FIG. 7 are the operations performed during the signal processing by the signal processing device 22 according to the embodiment with respect to the electrical current represented by a normal waveform.

Firstly, the photoelectric converter 35 is exposed to radiation (photons) and outputs the electrical current I represented by a current waveform 600 that is a normal waveform illustrated in FIG. 7. Herein, the photoelectric converter 35 outputs the electrical current I, which is represented by the current waveform 600, to the pileup determining circuit 220, the peak hold circuit 221, and the delay circuit 222.

The pileup determining circuit 220 calculates the differential value dI/dt by performing a differentiation operation with respect to the electrical current I that is represented by the current waveform 600 received from the photoelectric converter 35, and detects the zero crossing point from a differentiated waveform 603 representing the waveform of the differential value dI/dt. Then, the pileup determining circuit 220 generates a logic pulse 603a that causes rising if the zero crossing point in a rising curve is detected in the differentiated waveform 603, or causes falling if the zero crossing point in a falling curve is detected in the differentiated waveform 603. Subsequently, the pileup determining circuit 220 counts the number of times of rising of the logic pulse 603a within a predetermined period of time starting from the point of time of receiving the electrical current I represented by the current waveform 600. Herein, since rising of the logic pulse 603a is counted only once within the predetermined period of time, the pileup determining circuit 220 determines that a pileup phenomenon has not occurred and does not output a pileup signal.

The peak hold circuit 221 receives the electrical current I, which is represented by the current waveform 600, from the photoelectric converter 35 and, as illustrated in a peak hold waveform 607, holds the peak value Ip of the electrical current I and outputs it to the reference waveform generating circuit 223.

Herein, regardless of receiving the peak value Ip from the peak hold circuit 221, the reference waveform generating circuit 223 does not generate a reference waveform based on the peak value Ip since no pileup signal is received from the pileup determining circuit 220.

The delay circuit 222 receives the electrical current I, which is represented by the current waveform 600, from the photoelectric converter 35, and outputs to the integrator 225 an electrical current Id that is represented by a delay current waveform 609 having the output timing delayed by a predetermined period of time. Herein, the predetermined period of time implies the processing time taken by the reference waveform generating circuit 223 for assumedly generating a reference waveform based on the peak value Ip.

In the integrator 225, since the electrical current represented by a reference waveform is not received from the reference waveform generating circuit 223, the capacitor 225a does not perform an integration operation with respect to the electrical current. However, the capacitor 225b performs an integration operation with respect to the electrical current Id represented by the delay current waveform 609 output from the delay circuit 222, and outputs an electrical charge Qd represented by a delay-side charge waveform 613.

Since no pulse signal is received from the pileup determining circuit 220, the switching control circuit 224 outputs a switching signal ϕ1 (a switching signal 616 illustrated in FIG. 7) to the switching circuit 226. Upon receiving the switching signal ϕ1 from the switching control circuit 224, the switching circuit 226 closes the switching elements 226a and 226d and opens the switching elements 226b and 226c. In that case, the electrical charge Qd output by the capacitor 225b is input as an electrical charge Qa to the plus terminal of the differential amplifier 227 via the switching element 226d. Moreover, the grounding voltage is input as an electrical charge Qb (a reference charge) to the minus terminal of the differential amplifier 227 via the switching element 226a. Meanwhile, for example, as illustrated in the peak hold waveform 607 in FIG. 7, the peak hold circuit 221 can be configured to terminate the holding operation at the timing at which the switching control circuit 224 outputs the switching signal ϕ1.

When the electrical charge Qa representing the electrical charge Qd is input to the plus terminal and when the electrical charge Qb corresponding to the grounding voltage is input to the minus terminal, the differential amplifier 227 obtains the difference between the electrical charges Qa and Qb and outputs the difference as an electrical charge Q1 (a third difference charge) represented by an amplifier-output charge waveform 617. Then, the AD converter 228 performs asynchronous AD conversion with respect to the electrical charge Q1 at the timing at which the electrical charge Q1 is output from the differential amplifier 227 (i.e., at an AD conversion timing 618), and outputs the electrical charge Q1 in the form of a digital signal to the outside. The electrical charge Q1 is identical to the electrical charge obtained by integrating the electrical current Id represented by the delay current waveform 609, that is, identical to the electrical charge obtained by integrating the electrical current I represented by the current waveform 600.

After the photons are incident on the photoelectric converter 35, when the signal processing illustrated in FIG. 7 is performed with respect to the electrical current I represented by the normal waveform output from the photoelectric converter 35, the incident photons on the photoelectric converter 35 are counted as an event and the electrical charge in which the energy of photons is reflected can be obtained.

Meanwhile, for example, as illustrated in the delay-side charge waveform 613 illustrated in FIG. 7, the capacitor 225a may discharge the stored electrical charge at the timing at which the AD converter 228 performs AD conversion with respect to the electrical charge Q1 output from the differential amplifier 227.

Figure 8:
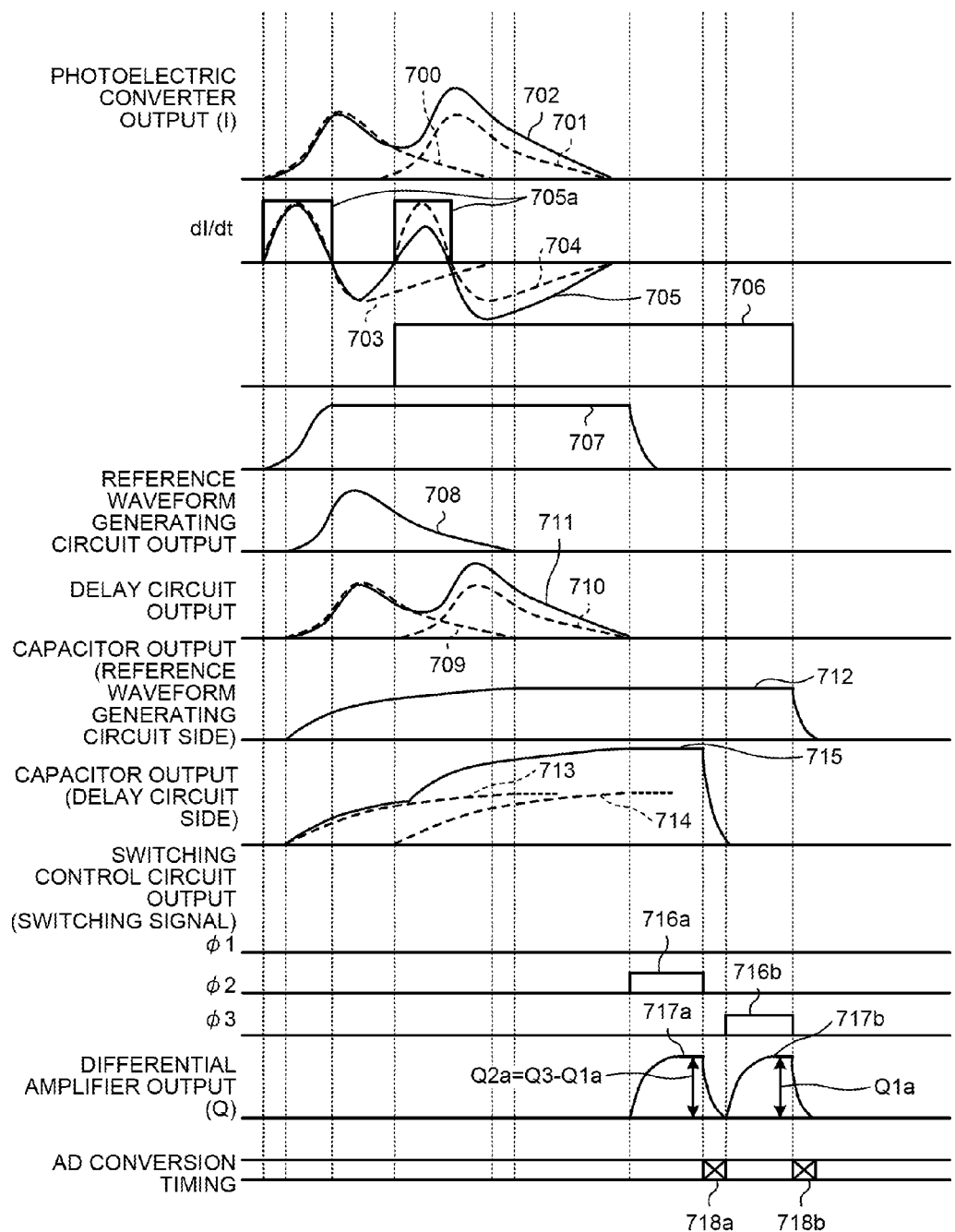
FIG. 8 is a timing chart of the signal processing performed by the signal processing device with respect to a pileup waveform.

FIG. 8 is a timing chart of the signal processing performed by the signal processing device with respect to a pileup waveform. Thus, explained with reference to FIG. 8 are the operations performed during the signal processing by the signal processing device 22 according to the embodiment with respect to the electrical current of a pileup waveform.

Firstly, the photoelectric converter 35 is exposed to radiation (photons) and outputs the electrical current represented by a current waveform 700 that is a normal waveform illustrated in FIG. 8. Moreover, the electrical current generated due to the next set of photons, which arrives before the tail portion of the normal waveform 510 decreases by a sufficient extent, gets added to the electrical current that is represented by the current waveform 700 and that is attributed to the initially-arrived photons in the state in which no electrical current is output from the photoelectric converter 35; and a higher electrical current than the height of the signal of the original electrical current (a current waveform 701 illustrated in FIG. 8) is generated (i.e., a pileup phenomenon occurs). In FIG. 8 is illustrated a pileup waveform 702 (including the overlapping portion with the current waveform 700) that piles up on the current waveform 700, which represents the waveform of the electrical current attributed to the initially-arrived photons in the state in which no electrical current is output from the photoelectric converter 35, and that represents the waveform appearing as a higher signal than the height of the signal of the original current waveform 701, which represents the waveform of the electrical current attributed to the subsequently-arrived photons.

The pileup determining circuit 220 calculates the differential value dI/dt by performing a differentiation operation with respect to the electrical current I represented by the pileup waveform 702 that is received from the photoelectric converter 35, and detects the zero crossing point from a pileup differentiated waveform 705 that is the waveform of the differential value dI/dt. Meanwhile, in FIG. 8, a differentiated waveform 703 represents the waveform of the differential value obtained as a result of performing the differentiation operation with respect to the electrical current represented by the current waveform 700; and a differentiated waveform 704 represents the waveform of the differential value obtained as a result of performing the differentiation operation with respect to the electrical current represented by the current waveform 701. Subsequently, the pileup determining circuit 220 generates a logic pulse 705a that causes rising if the zero crossing point in a rising curve is detected in the pileup differentiated waveform 705, or causes falling if the zero crossing point in a falling curve is detected in the pileup differentiated waveform 705. Then, the pileup determining circuit 220 counts the number of times of rising of the logic pulse 705a within a predetermined period of time starting from the point of time of receiving the electrical current I represented by the pileup waveform 702. Herein, since rising of the logic pulse 705a is counted twice during the predetermined period of time, the pileup determining circuit 220 determines that a pileup phenomenon has occurred, and outputs a pileup signal 706 at the point of time of the second-time counting to the reference waveform generating circuit 223 and the switching control circuit 224.

The peak hold circuit 221 receives the electrical current I represented by the pileup waveform 702 from the photoelectric converter 35; and holds the peak value Ip of the electrical current I as illustrated in a peak hold waveform 707 and then outputs the peak value Ip to the reference waveform generating circuit 223.

Herein, since a pileup signal is received from the pileup determining circuit 220, the reference waveform generating circuit 223 refers to the peak value Ip received from the peak hold circuit 221 and the time constant based on the resistance value of the quench resistance of the photoelectric conversion elements 32, and generates a reference waveform 708 that represents recreation of the current waveform 700 in the case of no occurrence of a pileup phenomenon regarding the waveform of the electrical current I. Then, the reference waveform generating circuit 223 outputs an electrical current Ir represented by the recreated reference waveform 708 to the integrator 225.

The delay circuit 222 receives the electrical current I represented by the pileup waveform 702 from the photoelectric converter 35; and outputs to the integrator 225 an electrical current Id that is represented by a delay pileup waveform 711 having the output timing delayed by a predetermined period of time. Herein, the predetermined period of time implies the processing time taken by the reference waveform generating circuit 223 for generating the reference waveform 708 based on the peak value Ip. With reference to FIG. 8, a delay current waveform 709 represents the waveform in which the output timing of the electrical current represented by the current waveform 700 is delayed by a predetermined period of time; and a delay current waveform 710 represents the waveform in which the output timing of the electrical current represented by the current waveform 701 is delayed by a predetermined period of time.

In the integrator 225, the capacitor 225a performs an integration operation with respect to the electrical current Ir represented by the reference waveform 708 that is output by the reference waveform generating circuit 223, and outputs an electrical charge Q1a (a first electrical charge) represented by a reference-side charge waveform 712. The capacitor 225b performs an integration operation with respect to the electrical current Id represented by the delay pileup waveform 711 output from the delay circuit 222, and outputs an electrical charge Q3 (a second electrical charge) represented by a delay-side pileup charge waveform 715. Meanwhile, with reference to FIG. 8, a delay-side current waveform 713 represents the waveform in the case in which the integration operation is performed with respect to the electrical current represented by the delay current waveform 709; and a delay-side current waveform 714 represents the waveform in the case in which the integration operation is performed with respect to the electrical current represented by the delay current waveform 710.

When the electrical charge Q1a is stored in the capacitor 225a and the electrical charge Q3 is stored in the capacitor 225b, the switching control circuit 224 firstly outputs a switching signal ϕ2 (a switching signal 716a illustrated in FIG. 8) to the switching circuit 226 in response to the fact that a pileup signal has been received from the pileup determining circuit 220. Upon receiving the switching signal ϕ2 from the switching control circuit 224, the switching circuit 226 closes the switching elements 226b and 226d and opens the switching elements 226a and 226c. In this case, the electrical charge Q3 output by the capacitor 225b is input as the electrical charge Qa to the plus terminal of the differential amplifier 227 via the switching element 226d. Moreover, the electrical charge Q1a output by the capacitor 225a is input as the electrical charge Qb to the minus terminal of the differential amplifier 227 via the switching element 226b. Meanwhile, for example, as illustrated in the peak hold waveform 707 in FIG. 8, the peak hold circuit 221 can be configured to terminate the holding operation at the timing at which the switching control circuit 224 outputs the switching signal φ2.

When the electrical charge Qa representing the electrical charge Q3 is input to the plus terminal and when the electrical charge Qb corresponding to the electrical charge Q1 is input to the minus terminal, the differential amplifier 227 obtains the difference between the electrical charges Qa and Qb and outputs the difference as an electrical charge Q2a (a first difference charge) represented by an amplifier-output charge waveform 717a. Then, the AD converter 228 performs asynchronous AD conversion with respect to the electrical charge Q2a at the timing at which the electrical charge Q2a is output from the differential amplifier 227 (i.e., at an AD conversion timing 718a), and outputs the electrical charge Q2a in the form of a digital signal to the outside. The electrical charge Q2a is identical to the electrical charge obtained by integrating the electrical current represented by the delay current waveform 710 that is the electrical charge obtained by subtracting the electrical charge Q1a, which is obtained by integrating the electrical current Ir represented by the reference waveform 708, (i.e., by subtracting the electrical charge obtained in the case of integrating the electrical current represented by the current waveform 700) from the electrical charge Q3 obtained by integrating the electrical current Id represented by the delay pileup waveform 711 (i.e., from the electrical charge obtained by integrating the electrical current I represented by the pileup waveform 702). That is, the electrical charge Q2a is identical to the electrical charge in the case of integrating the electrical current represented by the current waveform 701.

As a result of performing the signal processing illustrated in FIG. 8 with respect to the electrical current I represented by the pileup waveform 702, it becomes possible to obtain the electrical charge in the case of integrating the electrical current represented by the current waveform 701 that has piled up on the current waveform 700 and that cannot be directly subjected to integration to obtain the electrical charge. Thus, regarding the photons related to the current waveform 701 which has piled up on the current waveform 700 that is a normal waveform, the photons are counted as an event and the electrical charge in which the energy of photons is reflected can be obtained.

Meanwhile, for example, as illustrated in the delay-side pileup charge waveform 715 illustrated in FIG. 8, the capacitor 225b may discharge the stored electrical charge at the timing at which the AD converter 228 performs AD conversion with respect to the electrical charge Q2a output from the differential amplifier 227.

After the AD converter 228 performs AD conversion with respect to the electrical charge Q2a at the AD conversion timing 713a, the switching control circuit 224 outputs a switching signal φ3 (a switching signal 716b illustrated in FIG. 8) to the switching circuit 226. Upon receiving the switching signal φ3 from the switching control circuit 224, the switching circuit 226 closes the switching elements 226a and 226c and opens the switching elements 226b and 226d. In this case, the electrical charge Q1a output by the capacitor 225a is input as the electrical charge Qa to the plus terminal of the differential amplifier 227 via the switching element 226c. Moreover, the grounding voltage is input as the electrical charge Qb (the reference charge) to the minus terminal of the differential amplifier 227 via the switching element 226a.

When the electrical charge Qa representing the electrical charge Q1a is input to the plus terminal and when the electrical charge Qb corresponding to the grounding voltage is input to the minus terminal, the differential amplifier 227 obtains the difference between the electrical charges Qa and Qb and outputs the difference as the electrical charge Q1a (a second difference charge) represented by an amplifier-output charge waveform 717b. Then, the AD converter 228 performs asynchronous AD conversion with respect to the electrical charge Q1a at the timing at which the electrical charge Q1a is output from the differential amplifier 227 (i.e., at an AD conversion timing 718b), and outputs the electrical charge Q1a in the form of a digital signal to the outside. The electrical charge Q1a is identical to the electrical charge obtained by integrating the electrical current Ir represented by the reference waveform 708, that is, identical to the electrical charge obtained by integrating the electrical current represented by the current waveform 700.

As a result of performing the signal processing illustrated in FIG. 8 with respect to the electrical current I represented by the pileup waveform 702, regarding the electrical current represented by the current waveform 700 on which the current waveform 701 has piled up and which cannot be directly subjected to integration to obtain the electrical charge, integrating the electrical current Ir represented by the reference waveform 708 enables obtaining the electrical charge in the case of integrating the electrical current represented by the current waveform 700. Thus, regarding the photons related to the current waveform 700 which is a normal waveform but on which the current waveform 701 has piled up, the photons are counted as an event and the electrical charge in which the energy of photons is reflected can be obtained.

Meanwhile, for example, as illustrated in the reference-side charge waveform 712 illustrated in FIG. 8, the capacitor 225a may discharge the stored electrical charge at the timing at which the AD converter 228 performs AD conversion with respect to the electrical charge Q1a output from the differential amplifier 227.

In the case of receiving a pileup signal, firstly, the switching control circuit 224 outputs the switching signal and the differential amplifier 227 outputs the electrical charge Q2a. Then, the switching control circuit 224 outputs the switching signal φ3 and the differential amplifier 227 outputs the electrical charge Q1a. However, that is not the only possible case. Alternatively, the switching control circuit 224 can output the switching signal φ3 before outputting the switching signal φ2, and the differential amplifier 227 can output the electrical charge Q1a before outputting the electrical charge Q2a.

Figure 9:
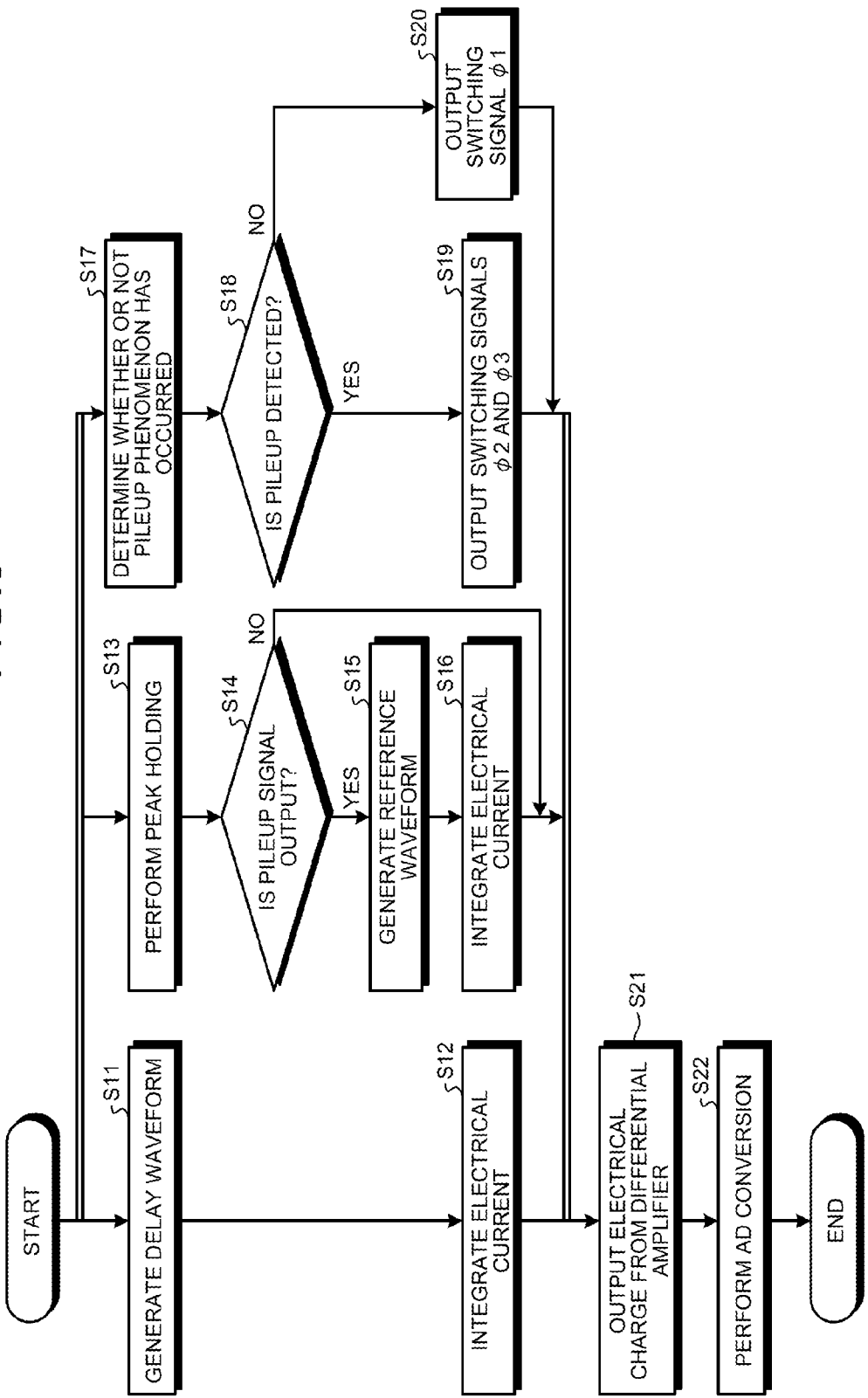
FIG. 9 is a flowchart for explaining the operations performed during the signal processing by the signal processing device.

FIG. 9 is a flowchart for explaining the operations performed during the signal processing by the signal processing device. Thus, explained with reference to FIG. 9 are the overall operations performed during the signal processing by the signal processing device 22 according to the embodiment.

Firstly, the photoelectric converter 35 is exposed to radiation (photons) and outputs the electrical current represented by a particular current waveform.

Step S11

The delay circuit 222 receives the electrical current I represented by the particular current waveform from the photoelectric converter 35, and outputs to the integrator 225 the electrical current Id that is represented by a delay current waveform having the output timing delayed by a predetermined period of time. Then, the system control proceeds to Step S12.

Step S12

The capacitor 225b in the integrator 225 performs an integration operation with respect to the electrical current Id represented by the delay current waveform output from the delay circuit 222, and outputs an electrical charge represented by a delay-side charge waveform. Then, at the point of time when the operation at Step S16 (described later) and the operation at Step S19 or Step S20 (described later) are completed, the system control proceeds to Step S21.

Step S13

The peak hold circuit 221 receives the electrical current I represented by a particular current waveform from the photoelectric converter 35, and holds the peak value Ip of the electrical current I. Moreover, the peak hold circuit 221 outputs the peak value Ip to the reference waveform generating circuit 223. Then, the system control proceeds to Step S14.

Step S14

If the pileup determining circuit 220 determines that a pileup phenomenon has occurred and outputs a pileup signal (Yes at Step S14), the system control proceeds to Step S15. However, if a pileup signal is not output (No at Step S14), the operations at Steps S15 and S16 are skipped.

Step S15

The reference waveform generating circuit 223 receives the pileup signal from the pileup determining circuit 220, refers to the peak value Ip received from the peak hold circuit 221 and the time constant based on the resistance value of the quench resistance of the photoelectric conversion elements 32, and generates a reference waveform that represents recreation of the current waveform in the case of no occurrence of a pileup phenomenon regarding the waveform of the electrical current I. Then, the reference waveform generating circuit 223 outputs the electrical current represented by the recreated reference waveform to the integrator 225. Subsequently, the system control proceeds to Step S16.

Step S16

The capacitor 225a in the integrator 225 performs an integration operation with respect to the electrical current Ir represented by the reference waveform that is output by the reference waveform generating circuit 223, and outputs an electrical charge represented by a reference-side charge waveform. Then, at the point of time when the operation at Step S12 and the operation at Step S19 or Step S20 (described later) are completed, the system control proceeds to Step S21.

Step S17

The pileup determining circuit 220 calculates the differential value dI/dt by performing a differentiation operation with respect to the electrical current I represented by a particular current waveform received from the photoelectric converter 35, and detects the zero crossing point from a differentiated waveform that is the waveform of the differential value dI/dt. Then, the pileup determining circuit 220 generates a logic pulse that causes rising if the zero crossing point in a rising curve is detected in the differentiated waveform, or causes falling if the zero crossing point in a falling curve is detected in the differentiated waveform. Subsequently, the pileup determining circuit 220 counts the number of times of rising of the logic pulse within a predetermined period of time starting from the point of time of receiving the electrical current I represented by a particular current waveform. If rising of the logic pulse is counted only once during the predetermined period of time, then the pileup determining circuit 220 detects that a pileup phenomenon has not occurred and does not output a pileup signal. On the other hand, if rising of the logic pulse is counted twice during the predetermined period of time, then the pileup determining circuit 220 determines that a pileup phenomenon has occurred, and outputs a pileup signal at the point of time of the second-time counting to the reference waveform generating circuit 223 and the switching control circuit 224. Then, the system control proceeds to Step S18.

Step S18

If the pileup determining circuit 220 detects a pileup phenomenon (Yes at Step S18), then the system control proceeds to Step S19. However, if the pileup determining circuit 220 does not detect a pileup phenomenon (No at Step S18), the system control proceeds to Step S20.

Step S19

When the electrical charge is stored in the capacitors 225a and 225b, the switching control circuit 224 firstly outputs the switching signal $\phi 2$ to the switching circuit 226 in response to the fact that a pileup signal has been received from the pileup determining circuit 220. Upon receiving the switching signal $\phi 2$ from the switching control circuit 224, the switching circuit 226 closes the switching elements 226b and 226d and opens the switching elements 226a and 226c. In this case, the electrical charge output by the capacitor 225b is input as the electrical charge Qa to the plus terminal of the differential amplifier 227 via the switching element 226d. Moreover, the electrical charge output by the capacitor 225a is input as the electrical charge Qb to the minus terminal of the differential amplifier 227 via the switching element 226b.

Meanwhile, after the electrical charge representing the difference between electrical charges input to the differential amplifier based on the switching signal $\phi 2$ is output at Step S21 (described later) and is subjected to AD conversion by the AD converter 228 at Step S22 (described later), the switching control circuit 224 outputs a switching signal $\phi 3$ to the switching circuit 226. Upon receiving the switching signal $\phi 3$ from the switching control circuit 224, the switching circuit 226 closes the switching elements 226a and 226c and opens the switching elements 226b and 226d. In this case, the electrical charge output by the capacitor 225a is input as the electrical charge Qa to the plus terminal of the differential amplifier 227 via the switching element 226c. Moreover, the grounding voltage is input as the electrical charge Qb to the minus terminal of the differential amplifier 227 via the switching element 226a.

Then, at the point of time when the operations at Steps S12 and S16 are completed, the system control proceeds to Step S21.

Step S20

Since a pileup signal has not been received from the pileup determining circuit 220, the switching control circuit 224 outputs the switching signal to the switching circuit 226. Upon receiving the switching signal $\phi 1$ from the switching control circuit 224, the switching circuit 226 closes the switching elements 226a and 226d and opens the switching elements 226b and 226c. In that case, the electrical charge output by the capacitor 225b is input as the electrical charge Qa to the plus terminal of the differential amplifier 227 via the switching element 226d. Moreover, the grounding voltage is input as the electrical charge Qb to the minus terminal of the differential amplifier 227 via the switching element 226a. Then, at the point of time when the operations at Steps S12 and S16 are completed, the system control proceeds to Step S21.

Step S21

When the electrical charge Qa is input to the plus terminal and when the electrical charge Qb is input to the minus terminal, the differential amplifier 227 obtains the difference between the electrical charges Qa and Qb and outputs the difference as an electrical charge Q. Then, the system control proceeds to Step S22.

Step S22

The AD converter 228 performs asynchronous AD conversion with respect to the electrical charge Q at the timing at which the electrical charge Q is output from the differential amplifier 227, and outputs the electrical charge Q in the form of a digital signal.

That marks the end of the operations performed during the signal processing by the signal processing device 22 according to the embodiment.

In this way, when a pileup phenomenon is detected in the current waveform received by the pileup determining circuit 220, firstly, the reference waveform generating circuit 223 refers to the peak value Ip received from the peak hold circuit 221 and the time constant based on the resistance value of the quench resistance of the photoelectric conversion elements 32; generates a reference waveform that represents recreation of the current waveform in the case of no occurrence of a pileup phenomenon regarding the waveform of the electrical current I; and outputs the electrical current Ir represented by the reference waveform to the integrator 225. The delay circuit 222 receives the electrical current I represented by a pileup waveform from the photoelectric converter 35, and outputs to the integrator 225 the electrical current Id that is represented by a delay current waveform having the output timing delayed by a predetermined period of time. The capacitor 225a performs an integration operation with respect to the electrical current Ir represented by the reference waveform that is output by the reference waveform generating circuit 223, and outputs the electrical charge Q1a represented by a reference-side charge waveform. The capacitor 225b performs an integration operation with respect to the electrical current Id represented by the delay pileup waveform output from the delay circuit 222, and outputs the electrical charge Q3 represented by a delay-side pileup charge waveform. Then, the differential amplifier outputs the electrical charge Q2a, which represents the difference between the electrical charges Q1a and Q3. The electrical charge Q2a is identical to the electrical charge obtained by integrating the electrical current represented by the current waveform 701 that is illustrated in FIG. 8 and that cannot be directly subjected to integration. Moreover, the differential amplifier 227 outputs the electrical charge Q1a based on the reference waveform. The electrical charge Q1a is identical to the electrical charge obtained by integrating the electrical current represented by the current waveform 700 that is illustrated in FIG. 8 and that cannot be directly subjected to integration. Hence, even if there occurs a pileup phenomenon in the electrical current output by the photoelectric converter 35, the photons related to the current waveform with respect to which the pileup phenomenon occurs (i.e., the current waveform 700 illustrated in FIG. 8) are counted as an event, and the electrical charge in which the energy of photons is reflected can be obtained. Besides, the photons related to the current waveform which causes the pileup phenomenon (i.e., the current waveform 701 illustrated in FIG. 8) are counted as an event, and the electrical charge in which the energy of photons is reflected can be obtained. Therefore, regarding the pileup-phenomenon-related current waveforms too, the events can be counted as events thereby making it possible enhance the accuracy of wave height discrimination.

Moreover, as a result of separating the pileup waveform using an analog circuit, there is no need to perform high-speed AD conversion and high-speed arithmetic processing in a digital circuit. That enables achieving reduction in the power consumption.

Furthermore, regarding the current waveforms that cannot be directly subjected to integration (the current waveforms 700 and 701 illustrated in FIG. 8), the respective electrical charges are subjected to AD conversion in an asynchronous manner. Hence, for example, in an X-ray CT device of the photon counting type, it becomes possible to reduce the data volume to be obtained.

Meanwhile, regarding the pileup-phenomenon-related current waveforms too, it is possible to obtain the electrical charge that is based on the electrical current of the current waveform that causes the pileup phenomenon and the current waveform with respect to which the pileup phenomenon occurs. Hence, a histogram of the electrical charge and the event count can also be created with accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A signal processing device comprising:
  a determiner configured to determine whether a pileup phenomenon has occurred in a first electrical current output from a photoelectric converter for converting incident radiation into the first electrical current in a direct manner or an indirect manner;
  a holder configured to hold an initial peak value of the first electrical current from the start of reception of the first electrical current from the photoelectric converter;
  a generator configured to, when the determiner determines that the pileup phenomenon has occurred, generate, using the peak value, a reference waveform that is equivalent to a normal waveform in a case in which a pileup phenomenon does not occur regarding the first electrical current;
  a first integrator configured to integrate a second electrical current represented by the reference waveform to calculate a first electrical charge;
  a second integrator configured to integrate the first electrical current output from the photoelectric converter to calculate a second electrical charge;
  a switcher configured to, when the determiner determines that the pileup phenomenon has occurred, perform switching to a first state in which the first electrical charge and the second electrical charge are output and to a second state in which the first electrical charge and a reference charge are output; and
  a difference calculator configured to
    calculate a first difference charge representing a difference between the first electrical charge and the second electrical charge output from the switcher, and calculate a second difference charge representing a difference between the first electrical charge and the reference charge output from the switcher.

2. The signal processing device according to claim 1, further comprising a converter configured to convert the first difference charge and the second difference charge into digital signals at mutually different timings.

3. The signal processing device according to claim 1, further comprising a delay circuit configured to delay the first electrical current output from the photoelectric converter, by a predetermined period of time before outputting the first electrical current, wherein
the second integrator is configured to integrate the first electrical current output from the delay circuit to calculate the second electrical charge.

4. The signal processing device according to claim 1, wherein
the determiner is configured to calculate a differential value of the first electrical current output from the photoelectric converter and detect a zero crossing point of the differential value, and
the determiner is configured to, when the zero crossing point in a rising curve is detected twice within a predetermined period of time starting from reception of the first electrical current from the photoelectric converter, determine that the pileup phenomenon has occurred in the first electrical current.

5. The signal processing device according to claim 1, wherein
the switcher is configured to, when the determiner determines that a pileup phenomenon has not occurred, perform switching so that the second electrical charge and the reference charge are output, and
the difference calculator is configured to, when the determiner determines that a pileup phenomenon has not occurred, calculate a third difference charge that represents a difference between the second electrical charge and the reference charge output from the switcher.

6. A radiation detecting device comprising:
the signal processing device according to claim 1;
a scintillator configured to convert the incident radiation into scintillation light having a longer wavelength than a wavelength of the incident radiation; and
the photoelectric converter configured to convert the scintillation light into the first electrical current.

7. A signal processing method comprising:
determining whether a pileup phenomenon has occurred in a first electrical current output from a photoelectric converter configured to convert incident radiation into the first electrical current in a direct manner or an indirect manner;
receiving the first electrical current from the photoelectric converter;
holding an initial peak value of the first electrical current from the start of reception of the first electrical current from the photoelectric converter;
generating, when it is determined that the pileup phenomenon has occurred, by using the peak value, a reference waveform that is equivalent to a normal waveform in a case in which a pileup phenomenon does not occur regarding the first electrical current;
integrating a second electrical current represented by the reference waveform to calculate a first electrical charge;
integrating the first electrical current output from the photoelectric converter to calculate a second electrical charge;
switching, when it is determined that the pileup phenomenon has occurred, to a first state in which the first electrical charge and the second electrical charge are output and to a second state in which the first electrical charge and a reference charge are output;
calculating a first difference charge representing a difference between the second electrical charge and the first electrical charge that are output; and
calculating a second difference charge representing a difference between the first electrical charge and the reference charge that are output.

\* \* \* \* \*